United States Patent
Leu et al.

(10) Patent No.: US 9,833,977 B2
(45) Date of Patent: Dec. 5, 2017

(54) SUBSTRATE STRUCTURES APPLIED IN FLEXIBLE ELECTRICAL DEVICES AND FABRICATION METHOD THEREOF

(75) Inventors: Chyi-Ming Leu, Jhudong Township (TW); Yueh-Chuan Huang, Jhudong Township (TW); Yung Lung Tseng, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 870 days.

(21) Appl. No.: 12/628,785

(22) Filed: Dec. 1, 2009

(65) Prior Publication Data
US 2010/0167031 A1 Jul. 1, 2010

(30) Foreign Application Priority Data

Dec. 30, 2008 (TW) ................. 97151362 A
Jul. 27, 2009 (TW) ................. 98125158 A

(51) Int. Cl.
*B32B 7/02* (2006.01)
*B05D 5/12* (2006.01)
(Continued)

(52) U.S. Cl.
CPC ............... *B32B 27/32* (2013.01); *B32B 3/04* (2013.01); *B32B 15/08* (2013.01); *B32B 27/08* (2013.01); *B32B 27/281* (2013.01); *B32B 27/283* (2013.01); *B32B 27/286* (2013.01); *B32B 27/308* (2013.01); *B32B 27/36* (2013.01); *B32B 27/365* (2013.01); *B32B 2255/10* (2013.01); *B32B 2255/205* (2013.01); *B32B 2255/26* (2013.01); *B32B 2255/28* (2013.01); *B32B 2307/748* (2013.01); *B32B 2457/00* (2013.01);
(Continued)

(58) Field of Classification Search
CPC ......... B32B 27/36; B32B 27/08; B32B 27/02; B32B 27/32; G11B 5/716
USPC ............................................... 428/212; 427/58
See application file for complete search history.

(56) References Cited

U.S. PATENT DOCUMENTS 5,290,909 A * 3/1994 Chen et al. ............. 528/353
6,027,958 A * 2/2000 Vu et al. ............. 438/110
(Continued)

FOREIGN PATENT DOCUMENTS

TW 200717808 5/2007
WO WO 2009126544 A1 * 10/2009

OTHER PUBLICATIONS

OA dated Nov. 28, 2011 from corresponding application No. TW 200717808.

*Primary Examiner* — Tahseen N Khan
(74) *Attorney, Agent, or Firm* — Hauptman Ham, LLP

(57) ABSTRACT

A substrate structure applied in flexible electrical devices is provided. The substrate structure includes a carrier, a first material layer overlying the carrier with a first area, a second material layer overlying the first material layer and the carrier with a second area, and a flexible substrate overlying the second material layer, the first material layer and the carrier with a third area, wherein the second area is larger than or equal to the first area, the third area is larger than the second area, and the flexible substrate has a greater adhesion force than that of the first material layer to the carrier. The invention also provides a method for fabricating the substrate structure.

10 Claims, 3 Drawing Sheets

(51) Int. Cl.
  *B32B 27/32* (2006.01)
  *B32B 15/08* (2006.01)
  *B32B 27/08* (2006.01)
  *B32B 27/28* (2006.01)
  *B32B 27/30* (2006.01)
  *B32B 27/36* (2006.01)
  *B32B 3/04* (2006.01)
  *H01L 29/786* (2006.01)
  *H01L 27/12* (2006.01)

(52) U.S. Cl.
  CPC .... *H01L 27/1218* (2013.01); *H01L 29/78603* (2013.01); *Y10T 428/24942* (2015.01)

(56) References Cited

U.S. PATENT DOCUMENTS

| | | | |
|---|---|---|---|
| 6,162,583 A * | 12/2000 | Yang et al. | 430/313 |
| 6,225,211 B1 * | 5/2001 | Tsui | 438/624 |
| 2003/0223138 A1 * | 12/2003 | Akiyama | 359/883 |
| 2007/0059854 A1 | 3/2007 | Huang et al. | |
| 2007/0065993 A1 * | 3/2007 | Wong et al. | 438/149 |
| 2007/0091062 A1 | 4/2007 | French et al. | |
| 2008/0121415 A1 * | 5/2008 | Oh | 174/254 |
| 2008/0211997 A1 * | 9/2008 | Chen et al. | 349/96 |
| 2010/0068483 A1 * | 3/2010 | Leu et al. | 428/212 |

* cited by examiner

SUBSTRATE STRUCTURES APPLIED IN FLEXIBLE ELECTRICAL DEVICES AND FABRICATION METHOD THEREOF

CROSS REFERENCE TO RELATED APPLICATIONS

This Application claims priority of Taiwan Patent Applications No. 97151362, filed on Dec. 30, 2008, and No. 98125158, filed on Jul. 27, 2009, the entirety of which is incorporated by reference herein.

BACKGROUND OF THE INVENTION

Field of the Invention

The invention relates to a substrate structure, and more particularly to a substrate structure capable of adjusting stress and fabrication method thereof.

Description of the Related Art

A flexible display is a development trend for new-generation displays, particularly an active flexible display. Compared to conventional heavy glass substrate with brittleness, development of light flexible plastic substrate is desirable, especially active full-color TFT display panel. Currently, fabrication techniques of active flexible display comprise a-Si TFT, LPTS TFT and OTFT. Display mediums comprise EPD, ECD, LCD and EL.

Fabrication processes are divided into batch type and roll to roll. A TFT apparatus can utilize batch type fabrication processes. However, development of substrate transfer and film separation techniques is required. The flexible display must be transferred to other plastic substrates from glass. For flexible displays using roll to roll fabrication processes, new apparatuses are required and some problems caused by rolling and contact must be overcome.

The batch-type fabrication process has three methods. A PES substrate is bonded to a silicon wafer. A 7" VGA (640×480) plastic LCD is obtained by a low-temperature a-Si TFT technique. In this manner, a transparent substrate material with heat-resistant, low thermal expansion coefficient, low light hysteresis and chemical stability is required, and combined with proper gel materials and an advanced release technique (SEC Corporation). An LPTS TFT back cover is fabricated on glass. The back cover is then removed from glass by laser annealing. The transfer technique plays an important role for this method. In the transfer technique, TFT devices with superior properties can be obtained due to no limitations by plastic substrates concerning fabrication temperature so that conventional transparent plastic substrate can be utilized (Seiko Epson Corporation). Polyimide is coated on glass to develop an a-Si TFT-EPD display. The polyimide substrate is then taken off from the glass by the transfer technique. When the polyimide substrate is directly coated on glass, the fabrication temperature is permitted to achieve 300° C. and above due to heat-resistant thereof. However, using laser annealing to remove glass substrate is also required (Philips Corporation).

A flexible TFT device with superior properties can be obtained by shaping a plastic substrate on glass and a TFT process. However, unbalanced stresses are generated on the upper and lower sides of the plastic substrate due to its asymmetrical structure, resulting in a winding flexible substrate.

BRIEF SUMMARY OF THE INVENTION

One embodiment of the invention provides a substrate structure applied in flexible electrical devices comprising a carrier, a first material layer overlying the carrier with a first area, a second material layer overlying the first material layer and the carrier with a second area, and a flexible substrate overlying the second material layer, the first material layer and the carrier with a third area, wherein the second area is larger than or equal to the first area, the third area is larger than the second area, and the flexible substrate has a greater adhesion force than that of the first material layer to the carrier.

One embodiment of the invention provides a method for fabricating a substrate structure applied in flexible electrical devices comprising providing a carrier, forming a first material layer on the carrier with a first area, forming a second material layer on the first material layer and the carrier with a second area, and forming a flexible substrate on the second material layer, the first material layer and the carrier with a third area, wherein the second area is larger than or equal to the first area, the third area is larger than the second area, and the flexible substrate has a greater adhesion force than that of the first material layer to the carrier.

A substrate structure fabricated using present semiconductor apparatuses applied in flexible optoelectrical devices such as active flexible displays and fabrication method thereof are provided by the invention. A liquid substrate material, inorganic oxide or nitride material, release material and glass are fabricated into a specific multiple-layered substrate structure. Optoelectrical devices or display devices can be fabricated on the substrate structure using present semiconductor apparatuses. After device fabrication is completed, the devices can be simply separated from the glass by cutting along the two ends or internal sides of the release layer. The inorganic oxide or nitride layer opposed to the optoelectrical devices can balance the stresses. The feature of the invention is that the liquid substrate material has greater adhesion force than that of the release material to the glass to ensure that the substrate structure is entirely in processes without peeling off and the devices are simply separated from the glass after device fabrication is completed and redundant substrate is cut. The inorganic oxide or nitride layer with a proper area conducted between the release layer (first material layer) and the substrate can balance the stresses.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
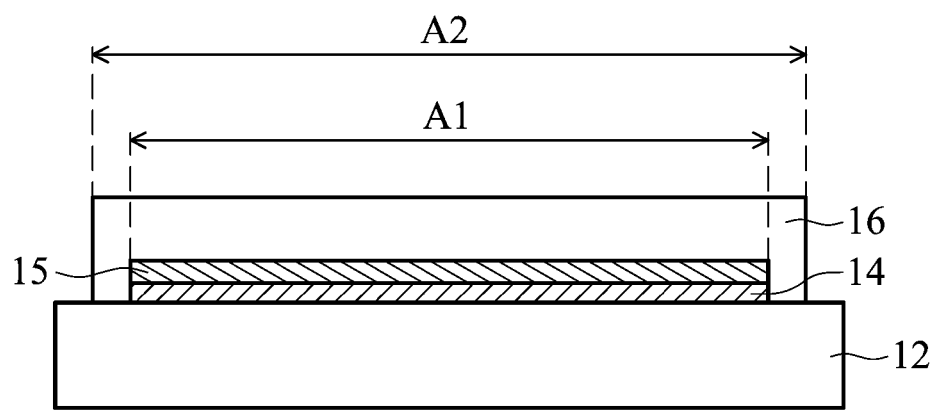
FIG. 1 is a cross-sectional view of a substrate structure applied in flexible electrical devices in an embodiment of the invention.

In an embodiment, a substrate structure applied in flexible electrical devices of the invention is shown in FIG. 1. The substrate structure 10 comprises a carrier 12, a first material layer 14, a second material layer 15 and a flexible substrate 16. The first material layer 14 is formed on the carrier 12 with a first area A1. The second material layer 15 is formed on the first material layer 14 and the carrier 12. Specifically, the second area A2 is larger than or equal to the first area A1. The flexible substrate 16 is formed on the second material layer 15, the first material layer 14 and the carrier 12 with a third area A3. Specifically, the third area A3 is larger than the second area A2 and the flexible substrate 16 has a greater adhesion force than that of the first material layer 14 to the carrier 12.

The carrier 12 may comprise glass or silicon wafer. The adhesion force of the first material layer 14 to the carrier 12 is 0 B. The first material layer 14 may serve as a release layer due to an extremely low adhesion force to the carrier 12.

The first material layer 14 may comprise parylene or cyclic olefin copolymers (COC). The second material layer 15 may comprise inorganic oxides such as aluminum oxide or silicon oxide, inorganic nitrides such as silicon nitride, or metal materials, with thickness of about 50-1,000 nm. In the invention, the second material layer 15 may serve as a stress control layer. The flexible substrate 16 may be a flexible display substrate, for example, an active flexible display substrate. The adhesion force of the flexible substrate 16 to the carrier 12 is 1-5 B. The flexible substrate 16 may comprise polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN) or polyetherimide (PEI).

The polyimide (PI) flexible substrate 16 has Formula (I):

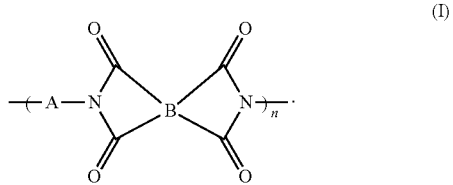

(I)

In Formula (I), A may comprise

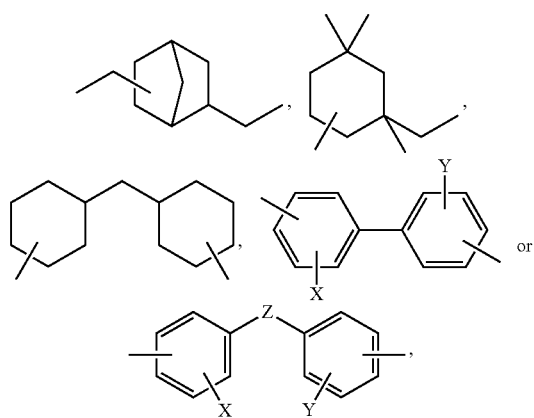

wherein X and Y may comprise hydrogen, methyl, trifluoromethyl, hydroxyl, —OR, bromine, chlorine or iodine, and Z may comprise —O—, —CH2—, —C(CH3)2—, —SO2—, —Ar—O—Ar—, —Ar—CH2—Ar—, —Ar—C(CH3)2—Ar— or —Ar—SO2—Ar—, wherein R may comprise C1-18 alkyl, and Ar is benzene.

B may comprise

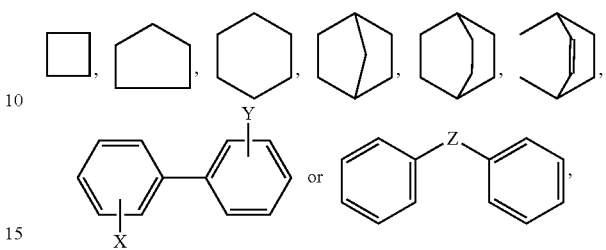

wherein X and Y may comprise hydrogen, methyl, trifluoromethyl, hydroxyl, —OR, bromine, chlorine or iodine, and Z may comprise —O—, —CH2—, —C(CH3)2—, —SO2—, —Ar—O—Ar—, —Ar—CH2—Ar—, —Ar—C(CH3)2—Ar— or —Ar—SO2—Ar—, wherein R may comprise C1-18 alkyl, and Ar is benzene. n may be an integer greater than 1.

The flexible substrate 16 may further comprise siloxane compounds or silicon dioxide to increase its adhesion force to the carrier 12.

In an embodiment, a method for fabricating a substrate structure applied in flexible electrical devices of the invention is shown in FIGS. 2A-2D.

Figure 2A:
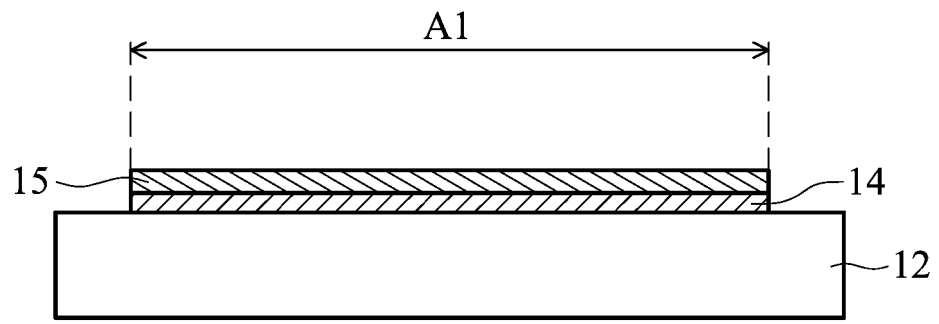
FIGS. 2A-2D are cross-sectional views of a method for fabricating a substrate structure applied in flexible electrical devices in an embodiment of the invention.

Referring to FIG. 2A, a carrier 12 having a first material layer 14 formed thereon with a first area A1 is provided. The first material layer 14 is formed on the carrier 12 by, for example, coating or evaporation. A second material layer 15 is then formed on the first material layer 14 and the carrier 12 with a second area A2. Specifically, the second area A2 is larger than or equal to the first area A1.

Figure 2B:
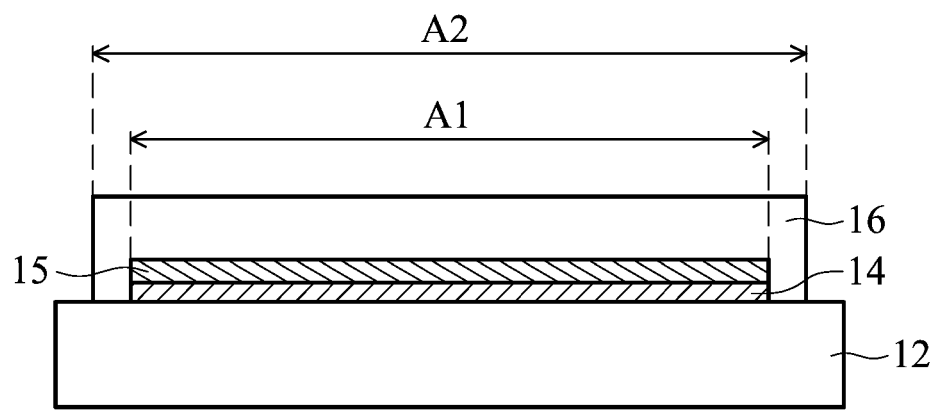

Next, referring to FIG. 2B, a flexible substrate 16 is formed on the second material layer 15, the first material layer 14 and the carrier 12 with a third area A3 by such as coating. Specifically, the third area A3 is larger than the second area A2 and the flexible substrate 16 has a greater adhesion force than that of the first material layer 14 to the carrier 12. After baking, the substrate structure is completed. Optoelectrical devices or display devices can be fabricated on the substrate structure using present semiconductor apparatuses.

Figure 2C:
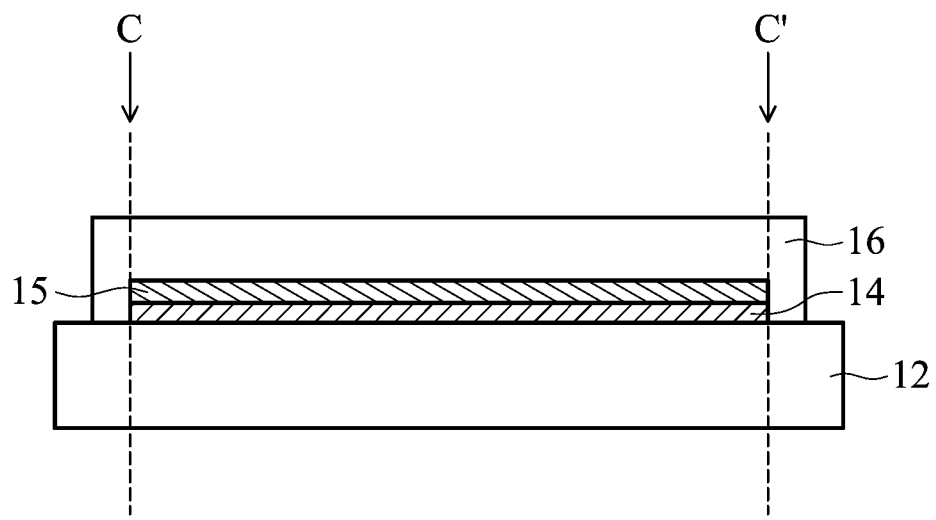
Figure 2D:
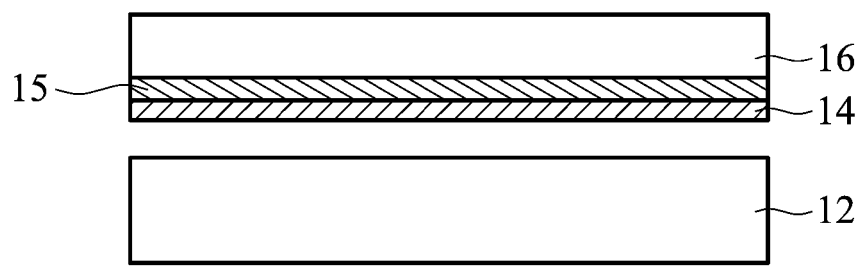

Next, referring to FIG. 2C, a portion of the flexible substrate 16 and the carrier 12 is cut along two ends (C and C') of the first material layer 14 to separate the first material layer 14, the flexible substrate 16 and the carrier 12, as shown in FIG. 2D.

EXAMPLES

A first material layer (release layer), for example parylene, is formed on a TFT glass. The area of the release layer is determined by a hollow pad. Next, a second material layer (stress control layer), for example aluminum oxide or silicon oxide, is formed on the first material layer. The area of the second material layer can be larger than or equal to that of the first material layer. A liquid substrate material with a larger area (larger than the second material layer) is then coated on the glass with parylene (the first material layer) and the second material layer formed thereon. After drying, a substrate structure applied in, for example active flexible displays, is formed. Optoelectrical devices or display devices can be fabricated on the substrate structure using present semiconductor apparatuses. After device fabrication is completed, a portion of the substrate structure is cut along the two ends or internal sides of the release layer to separate the devices from the glass.

Example 1

Preparation of Silicon Dioxide/Polyimide (BB-37)/Aluminum Oxide/Parylene/Glass Substrate Structure 3 g silicon dioxide (with 20% solid content dissolved in DMAc) and 7 g B1317-BAPPm (BB) (with 20% solid content dissolved in DMAc) were placed in a sample bottle. 0.3 g amino siloxane was then added to prepare a solution and stirred for 30 min under room temperature. Next, the solution was coated on a glass plated with 100 nm parylene and 100 nm aluminum oxide using a scraper. The glass was then baked in various ovens (80° C. and 150° C.) respectively for 1 hour. A silicon dioxide/polyimide (BB-37)/aluminum oxide/parylene/glass substrate structure was prepared. The parylene was prepared by thermal evaporation. The aluminum oxide was prepared by RF sputtering. The RF power was 200 W. The working pressure was 2 mtorr. The gas flow rate was 13 sccm Ar. The area of the aluminum oxide is larger than that of the parylene.

Example 2

Preparation of Silicon Dioxide/Polyimide (BB-37)/Aluminum Oxide/Parylene/Glass Substrate Structure 3 g silicon dioxide (with 20% solid content dissolved in DMAc) and 7 g B1317-BAPPm (BB) (with 20% solid content dissolved in DMAc) were placed in a sample bottle. 0.3 g amino siloxane was then added to prepare a solution and stirred for 30 min under room temperature. Next, the solution was coated on a glass plated with 100 nm parylene and 250 nm aluminum oxide using a scraper. The glass was then baked in various ovens (80° C. and 150° C.) respectively for 1 hour. A silicon dioxide/polyimide (BB-37)/aluminum oxide/parylene/glass substrate structure was prepared. The parylene was prepared by thermal evaporation. The aluminum oxide was prepared by RF sputtering. The RF power was 200 W. The working pressure was 2 mtorr. The gas flow rate was 13 sccm Ar. The area of the aluminum oxide is larger than that of the parylene.

Example 3

Preparation of Silicon Dioxide/Polyimide (BB-37)/Aluminum Oxide/Parylene/Glass Substrate Structure 3 g silicon dioxide (with 20% solid content dissolved in DMAc) and 7 g B1317-BAPPm (BB) (with 20% solid content dissolved in DMAc) were placed in a sample bottle. 0.3 g amino siloxane was then added to prepare a solution and stirred for 30 min under room temperature. Next, the solution was coated on a glass plated with 100 nm parylene and 450 nm aluminum oxide using a scraper. The glass was then baked in various ovens (80° C. and 150° C.) respectively for 1 hour. A silicon dioxide/polyimide (BB-37)/aluminum oxide/parylene/glass substrate structure was prepared. The parylene was prepared by thermal evaporation. The aluminum oxide was prepared by RF sputtering. The RF power was 200 W. The working pressure was 2 mtorr. The gas flow rate was 13 sccm Ar. The area of the aluminum oxide is larger than that of the parylene.

Example 4

Preparation of PES/Aluminum Oxide/Parylene/Glass Substrate Structure 2 g PES and 8 g DMAc were placed in a sample bottle. 0.1 g epoxy siloxane was then added to prepare a solution and stirred for 30 min under room temperature. Next, the solution was coated on a glass plated with 100 nm parylene and 250 nm aluminum oxide using a scraper. The glass was then baked in various ovens (80° C. and 150° C.) respectively for 1 hour. A silicon dioxide/polyimide (BB-37)/aluminum oxide/parylene/glass substrate structure was prepared. The parylene was prepared by thermal evaporation. The aluminum oxide was prepared by RF sputtering. The RF power was 200 W. The working pressure was 2 mtorr. The gas flow rate was 13 sccm Ar. The area of the aluminum oxide is larger than that of the parylene.

Comparative Example 1

Preparation of Silicon Dioxide/Polyimide (BB-37)/Parylene/Glass Substrate Structure 3 g silicon dioxide (with 20% solid content dissolved in DMAc) and 7 g B1317-BAPPm (BB) (with 20% solid content dissolved in DMAc) were placed in a sample bottle. 0.2 g amino siloxane was then added to prepare a solution and stirred for 30 min under room temperature. Next, the solution was coated on a glass plated with 100 nm parylene using a scraper. The glass was then baked in various ovens (80° C. and 150° C.) respectively for 1 hour. A silicon dioxide/polyimide (BB-37)/parylene/glass substrate structure was prepared.

After the substrate structure preparation, electrical devices were disposed within the release layer. A portion of the substrate and the release layer were cut along the two ends or the inside of the release layer to separate the substrate and the electrical devices from the glass.

Comparison of the shapes of the released substrates of Examples 1-4 and Comparative Example 1 was shown in Table 1.

TABLE 1

|  | Substrate shape |
| --- | --- |
| Example 1 | − |
| Example 2 | + |
| Example 3 | ++ |
| Example 4 | ++ |
| Comparative Example 1 | −− |

−−: downward winding −: flatness +: upward winding ++: seriously upward winding

The results indicate that after disposing a stress control layer (second material layer) such as aluminum oxide between a release layer (first material layer) and a flexible substrate, the shape of the released substrate is altered from downward winding to flatness or upward winding. The upward-winding substrate effectively balances the stresses in subsequent processes.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A substrate structure applied in flexible electrical devices, comprising:
   a carrier;
   a first material layer overlying the carrier with a first area, wherein the first material layer comprises parylene or cyclic olefin copolymers (COC);
   a second material layer directly formed on the first material layer with a second area, wherein the second area is larger than or equal to the first area, and the second material layer comprises aluminum oxide; and
   a flexible substrate overlying the second material layer, the first material layer and the carrier with a third area, and directly contacting the carrier,
   wherein the third area is larger than the second area and the flexible substrate has a greater adhesion force to the carrier than that of the first material layer to the carrier.

2. The substrate structure applied in flexible electrical devices as claimed in claim 1, wherein the carrier comprises glass or silicon wafer.

3. The substrate structure applied in flexible electrical devices as claimed in claim 1, wherein the adhesion force of the first material layer to the carrier is less than or equal to 1B.

4. The substrate structure applied in flexible electrical devices as claimed in claim 1, wherein the second material layer has thickness of 50-1,000nm.

5. The substrate structure applied in flexible electrical devices as claimed in claim 1, wherein the adhesion force of the flexible substrate to the carrier is 1-5B.

6. The substrate structure applied in flexible electrical devices as claimed in claim 1, wherein the flexible substrate comprises polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN) or polyetherimide (PEI).

7. The substrate structure applied in flexible electrical devices as claimed in claim 6, wherein the polyimide (PI) has Formula (I):

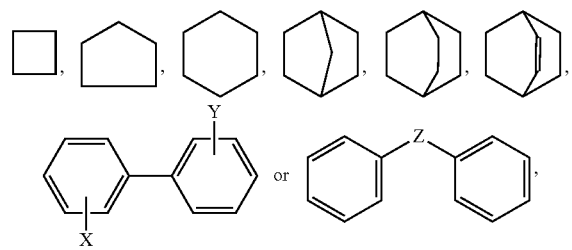

(I)

wherein
A comprises

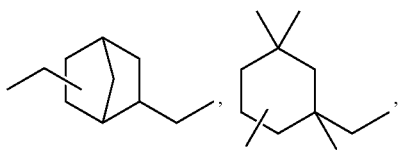

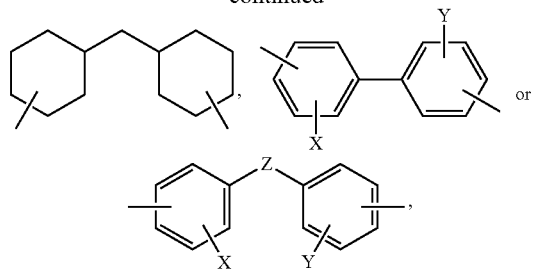

wherein X and Y comprise hydrogen, methyl, trifluoromethyl, hydroxyl, -OR, bromine, chlorine or iodine, and Z comprises —O—, —CH2—, —C(CH3)2—, —SO2—, —Ar—O—Ar—, —Ar—CH2—Ar—, —Ar—C(CH3)2—Ar— or —Ar—SO2—Ar—, wherein R comprises C1-18 alkyl, and Ar is benzene;
B comprises

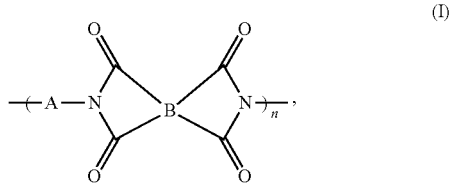

wherein X and Y comprise hydrogen, methyl, trifluoromethyl, hydroxyl, —OR, bromine, chlorine or iodine, and Z comprises —O—, —CH2—, —C(CH3)2—, —SO2—, —Ar—O—Ar—, —Ar—CH2—Ar—,— Ar—C(CH3)2—Ar— or —Ar—SO2—Ar—, wherein R comprises C1-18 alkyl, and Ar is benzene; and
n is an integer greater than 1.

8. The substrate structure applied in flexible electrical devices as claimed in claim 6, wherein the flexible substrate further comprises siloxane compounds.

9. The substrate structure applied in flexible electrical devices as claimed in claim 8, wherein the flexible substrate further comprises silicon oxide.

10. A substrate structure applied in flexible electrical devices, comprising:
    a carrier;
    a first material layer overlying the carrier with a first area, wherein the first material layer comprises parylene or cyclic olefin copolymers (COC);
    a second material layer directly formed on the first material layer with a second area, wherein the second area is larger than the first area, and the second material layer comprises aluminum oxide; and
    a flexible substrate overlying the second material layer, the first material layer and the carrier with a third area, and directly contacting the carrier,
    wherein the third area is larger than the second area and the flexible substrate has a greater adhesion force to the carrier than that of the first material layer to the carrier.

* * * * *